United States Patent [19]

Jackson et al.

[11] Patent Number: 4,751,708
[45] Date of Patent: Jun. 14, 1988

[54] SEMICONDUCTOR INJECTION LASERS

[75] Inventors: Thomas N. Jackson, Ossining; Jerry M. Woodall, Bedford Hills, both of N.Y.

[73] Assignee: International Business Machines Corporation, Armonk, N.Y.

[21] Appl. No.: 363,193

[22] Filed: Mar. 29, 1982

[51] Int. Cl.$^4$ ............................................... H01S 3/19
[52] U.S. Cl. ...................................... 372/49; 357/17; 357/52; 372/44
[58] Field of Search ...................... 372/49, 44; 357/17, 357/52

[56] References Cited

U.S. PATENT DOCUMENTS

| 3,849,738 | 11/1974 | Hakki | 372/49 |
| 4,001,719 | 1/1977 | Krupka | 372/49 |
| 4,062,035 | 12/1977 | Winstel | 357/17 |
| 4,178,564 | 12/1979 | Ladany et al. | 372/49 |
| 4,354,198 | 10/1982 | Hodgson et al. | 357/16 |

FOREIGN PATENT DOCUMENTS

| 0027474 | 7/1980 | Japan | 372/49 |
| 2005917 | 4/1979 | United Kingdom . | |
| 2047962 | 12/1980 | United Kingdom . | |

OTHER PUBLICATIONS

W. Heitmann, "Reactivity Evaporated Films of Scandia and Yittria", Applied Optics, vol. 12, No. 2, Feb. 1973, pp. 394–397.

Primary Examiner—James W. Davie
Attorney, Agent, or Firm—Thomas J. Kilgannon

[57] ABSTRACT

Degradation of the cleaved light output surface of a semiconductor crystal injection laser is reduced through control of surface recombination by providing an annealed optically transparent coating at least one ingredient of which has a higher bandgap than said crystal over the cleaved light output surface. Crystals of GaAs, GaAlAs and GaInAsP are provided with annealed coatings of ZnS, CdS, CdTe and CdSe.

5 Claims, 1 Drawing Sheet

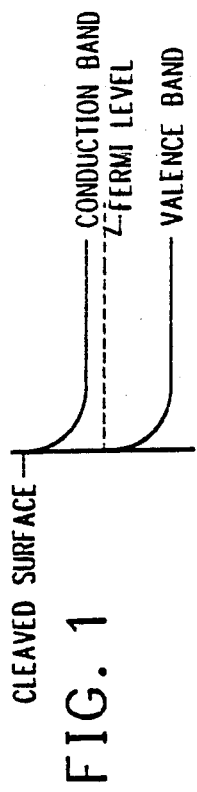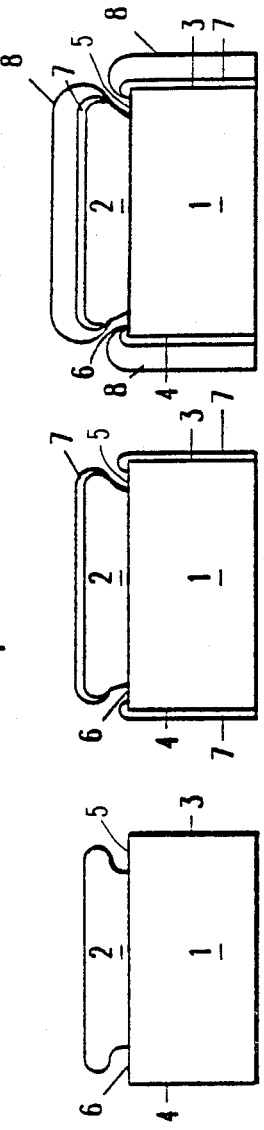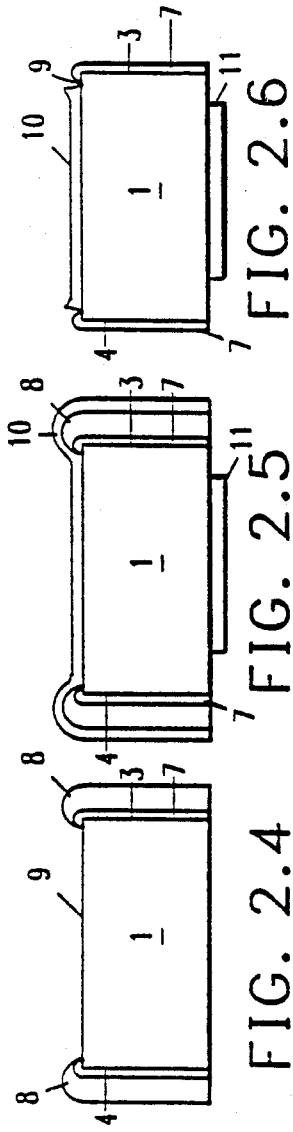

SEMICONDUCTOR INJECTION LASERS

DESCRIPTION

1. Technical Field

The technical field of the invention is that of semiconductor injection lasers wherein an input current is converted to a coherent light output. Injection lasers employ a semiconductor crystal of a binary or mixed compound of elements usually from group III and group V of the periodic table. In these structures, a cleaved surface of the semiconductor crystal is employed as a partially reflecting mirror at the ends of the laser cavity. The cleaved mirror surface tends, in use, to degrade catastrophically when the laser operates at high current values and it degrades systematically when the laser is operated at lower current values. This degradation places a limit on the usefulness of the structure.

2. Background Art

The degradation problem has been recognized in the art. Catastrophic degradation at high power densities is discussed in Journal of Applied Physics 50(8), August 1979, page 5150, and in Applied Physics Letters 34(10), May 15, 1979, page 637. The solution proposed in these articles is formation of a diffused region in the vicinity of the cleaved light output surface. Gradual degradation is discussed in Japanese Journal of Applied Physics 17, May 5, 1978, page 865. The solution proposed in this article is the epitaxial growth of a crystal lattice matched region between the body of the device and the cleaved light output surface.

BRIEF DESCRIPTION OF THE DRAWINGS

FIG. 1 is an energy level diagram illustrative of the energy band bending at a cleaved surface.

FIGS. 2.1 to 2.6 are a series of illustrations of structures at individual process steps in producing the invention.

DISCLOSURE OF THE INVENTION

In accordance with the invention, it has been found that the degradation at the cleaved light output surface of an injection laser is due to localized heating at the surface resulting from surface recombination of the carriers due to energy band bending at the cleaved surface of the semiconductor and that for an injection laser semiconductor crystal including GaAs, GaAlAs or GaInAsP as examples, a simple annealed coating of an optically transparent compound having at least one ingredient thereof with a higher bandgap will not only reduce the degradation but also will increase the optical power density at which any degradation takes place. The annealed coating, for example, may be of the group including ZnS, CdS, CdTe and CdSe.

In the annealing operation, at least one component of the coating material migrates and interacts with at least one species or element of the laser crystal material responsible for the energy band bending.

The annealing is conducted at a temperature sufficient to penetrate any oxide between the coating and the laser crystal yet the temperature should be lower than that which would damage the laser crystal or evaporate the coating. The annealing time should be less than would produce long range diffusion. A temperature range of from 400° to 800° K. for 100 to 1000 minutes is considered satisfactory.

Referring to FIG. 1, an energy band diagram is shown that illustrates the problem produced by the conditions at the cleaved light output surface. The cleaved crystal surface has properties which result in the bending of the energy bands as they approach the surface so that a carrier is induced to recombine. The energy released when recombination occurs is converted to heat at this localized region which damages the semiconductor.

This invention is the control of degradation by providing a simple annealed coating on the cleaved light output surface.

The annealed coating material has the properties of thickness for optical transparency and has at least one element thereof with an energy bandgap that is larger than that of the laser semiconductor crystal.

The annealed coating material of the invention inhibits recombination and should be contrasted with the prior art approaches achieved by diffusion and epitaxial growth because while such regions do reduce the degradation, they require either the high temperatures of diffusion or the lattice matching constraints of epitaxial growth and hence frequently interfere with other processing and structural arrangements. In such prior art structures the lasing threshold current is usually increased and the reproducibility of the devices becomes more difficult since the region thickness adjacent to the cleaved light output surface becomes a critical parameter and is an additional parameter to control. Relaxation of the lattice matching consideration is a major advantage.

The coating of the invention in contrast is simple, is placed over the cleaved surface and does not interfere with other processing requirements.

BEST MODE FOR CARRYING OUT THE INVENTION

The preferred embodiment of the invention is an annealed coating of an optically transparent compound having at least one element thereof with an energy bandgap that is larger than that of the laser semiconductor crystal. These conditions are satisfied by a coating of ZnS on the cleaved light output surfaces of a GaAs injection laser.

Referring next to FIGS. 2.1 to 2.6, a series of illustrations of structures are provided to show the fabrication of the invention. In general, the annealed coating ZnS is applied to the ends of the laser active region. The coating may be applied by sputtering. The coating is in a thickness that is optically transparent of the order of 0.02 to 2 $\mu$m. The annealing is done by heating the GaAs laser with the ZnS coating over the cleaved light output surfaces for 100–1000 minutes at 600°–800° K.

The laser active region in FIGS. 2.1–2.6 while only illustrated to the detail needed for the invention may also include a heterojunction bounded cavity as is standard practice in the art.

Since annealing must be done carefully to avoid contact degradation, a process of providing the structure of FIG. 2.6 is shown in FIGS. 2.1 through 2.6 wherein the coating over the cleaved surfaces and subsequent annealing, can take place prior to the application of the contacts.

Referring to FIG. 2.1, a body 1 is provided which is a cleaved laser or in the alternative a row of cleaved lasers. A mask 2 such as a positive photoresist is applied by set back from each cleaved light output surface 3 and 4 in areas 5 and 6, respectively. The mask 2 is usually applied prior to the cleaving of the surfaces 3 and 4.

Providing the mask 2 with an overhang such as by a chlorobenzene soak type process will facilitate later steps where materials are to be kept off areas 5 and 6.

In connection with the illustration of FIG. 2.2, a coating 7 of the material ZnS is applied evenly over the areas by a directional deposition that prevents covering the areas 5 and 6. The process of sputtering at room temperature operates satisfactorily for this purpose. It is helpful if the coating covers only the cleaved mirror surfaces 3 and 4 and the mask 2 but is not continuous over the side of the mask 2 and into the regions 5 and 6. An overhang on the mask facilitates this.

Referring next to FIG. 2.3, a thick coating 8 of a protective material, such as $SiO_2$, $Si_3N_4$, or glass, is applied to the mask 2 and the coating 7. The function of the coating 8 will be to delineate ohmic contact areas to be added later.

As illustrated in FIG. 2.4, the mask 2 has been removed exposing the upper surface 9 of the laser. At this point in the processing, any thermal annealing steps found desirable for the particular coating material 7 are to be conducted so that the annealing temperature will not affect or degrade the ohmic contacts since at this point they have not been applied.

Referring next to FIG. 2.5, the device ohmic electrical contacts are applied. In this operation, a metallization coating is applied such as by the process of vacuum evaporation. The metallization operation provides a coating 10 which also covers the thick coatings 8 and is in contact with the surface 9. A separate ohmic contact 11 is also made to the surface opposite to the surface 9 either in the same metallization or in a separate operation.

The final device is illustrated in FIG. 2.6 wherein the technique of "lift-off" standard in the art is employed. The "lift-off" technique relies on the removal of support from a coating so that the coating literally breaks at a desired point. In FIG. 2.6, the coating 8 is dissolved in an etchant such as hydrofluoric acid so that the metallization 10 over the coating 8 breaks at the intersection with the surface 9. The coating 8 and the metal 10 thereover on each cleaved surface is lifted off and the structure of FIG. 2.6 is the result. In the structure of FIG. 2.6, the remaining metal 10 in contact with the surface 9 is one ohmic device contact and the other ohmic device contact 11. The annealing coatings 7 on each cleaved light output surface serve as surface recombination controlling windows over those cleaved surfaces 3 and 4.

What has been described is a technique for control of surface recombination which results in a limitation on power output from the cleaved faces of semiconductor lasers produced by local heating of the laser facets due to absorption of the laser light in depleted regions near the facets and the overcoming of this surface recombination by providing an annealed coating window of optically transparent compound material having at least one element of the compound that has a bandgap higher than that of the semiconductor laser crystal to prevent the surface recombination.

Having thus described our invention, what we claim as new and desire to secure by Letters Patent is:

1. In a semiconductor crystal laser of the type having an active lasing region in a laser crystal of semiconductor material essentially perpendicular to a cleaved light output surface, the improvement for reducing heating produced by carrier surface recombination at said cleaved surface comprising, an annealed coating of an optically transparent compound, at least one element thereof having a higher bandgap than that of said laser crystal.

2. The laser of claim 1 wherein said semiconductor is selected from the group consisting of GaAs, GaAlAs and GaInAsP.

3. The laser of claim 2 wherein said annealed coating is selected from the group consisting of NZnS, CdS, CdTe and CdSe.

4. In a semiconductor crystal injection laser having at least one cleaved light output surface and ohmic contacts on the surfaces perpendicular thereto, the improvement comprising an annealed optically transparent coating of a surface recombination control material, at least one ingredient of which has a bandgap greater than that of said semiconductor crystal covering said at least one cleaved surface.

5. The improvement of claim 4 wherein said semiconductor crystal of said laser is selected from a group consisting of GaAs, GaAlAs and GaInAsP and said recombination control material is a member selected from the group consisting of ZnS, CdS, CdTe and CdSe.

* * * * *